United States Patent
Fossum

(10) Patent No.: US 6,215,428 B1
(45) Date of Patent: Apr. 10, 2001

(54) DIFFERENTIAL NON-LINEARITY CORRECTION SCHEME

(75) Inventor: Eric R. Fossum, La Crescenta, CA (US)

(73) Assignee: Photobit Corporation, Pasadena, CA (US)

( * ) Notice: Subject to any disclaimer, the term of this patent is extended or adjusted under 35 U.S.C. 154(b) by 0 days.

(21) Appl. No.: 09/170,944

(22) Filed: Oct. 13, 1998

Related U.S. Application Data

(60) Provisional application No. 60/062,854, filed on Oct. 14, 1997.

(51) Int. Cl.[7] .................................................. H03M 1/06
(52) U.S. Cl. .................................. 341/118; 341/155
(58) Field of Search .............................. 341/172, 163, 341/144, 155, 118

(56) References Cited

U.S. PATENT DOCUMENTS

| | | | |
|---|---|---|---|
| 4,385,286 | * | 5/1983 | Haque .................................. 341/144 |
| 4,404,544 | * | 9/1983 | Dwarakanath ....................... 341/172 |
| 4,618,847 | * | 10/1986 | Iida et al. ............................. 341/144 |
| 4,764,750 | * | 8/1988 | Kawada ................................ 341/163 |
| 4,831,381 | * | 5/1989 | Hester .................................. 341/172 |
| 4,908,620 | * | 3/1990 | Fujisawa .............................. 341/108 |
| 5,258,761 | * | 11/1993 | Fotoubi et al. ....................... 341/172 |
| 5,416,485 | * | 5/1995 | Lee ...................................... 341/172 |
| 5,581,252 | * | 12/1996 | Thomas ................................ 341/144 |

* cited by examiner

*Primary Examiner*—Peguy JeanPierre
(74) *Attorney, Agent, or Firm*—Fish & Richardson P.C.

(57) ABSTRACT

Differential non-linearity errors in an A/D converter are corrected by an analog system. The system produces different analog voltages which are used to correct the input voltage to the capacitor. The input voltage is changed by an amount which is effective to correct the CAV to be the same as it would have been if the DNL error had not occurred.

9 Claims, 1 Drawing Sheet

DIFFERENTIAL NON-LINEARITY CORRECTION SCHEME

CROSS REFERENCE TO RELATED APPLICATIONS

This application claims the benefit of the U.S. provisional Application No. 60/062,854, filed on Oct. 14, 1997, which is incorporated herein by reference.

FIELD

The present specification describes a technique of correcting for differential non-linearity in an A/D converter.

BACKGROUND

Certain A/D converters, including a successive approximation A/D converter, operate based on calibrated capacitors.

A plurality of capacitors are provided. Each capacitor has a capacitance that is related to the other capacitors according to powers of 2. Hence, the capacitors produce an output charge where each represents one bit of the final digital signal. The A/D converter uses these capacitors to estimate the digital signal that it will produce.

The estimation includes changing each bit between a 1 and 0, which effectively changes the connection to each capacitor. FIG. 1 shows the connection to each capacitor C1, C2, C3, being switched between two voltages: the source voltage VDD and ground. The switching is based on whether the bit associated with that capacitor is 1 or 0. The number of switches and number of capacitors hence corresponds to the number of bits, with one capacitor being associated with one bit.

The output of the capacitor string is used by the A/D converter 100 to produce its output 102. The output 102 depends, upon other things, on the accuracy of the capacitors and their scaling.

As described above, each capacitor has a capacitance value which should be equal to a basic capacitance value $C_x \times 2_2^n$, where n+1 is the number of bits of resolution of the A to D converter.

Even though the capacitors are scaled relative to one another, there are often errors in the scaling. A differential non-linearity can occur based on errors in the relationship of the sizes and capacities of the capacitors. The mechanisms and causes of differential non-linearities are well known in the art.

The differential non-linearities cause certain codes in the output of the A/D converter to be missing. This effectively reduces the dynamic range of the A/D converter, causes granularity, and also may be perceived as noise. It is desirable to correct the differential non-linearity.

It has been suggested to correct a differential non-linearity by using a look-up table for each value. This, however, requires a lot of memory.

A co-pending and commonly-assigned application suggests correcting the differential non-linearity by assigning a correction value to each active bit.

The present specification teaches a different solution to solving differential non-linearity problems. This is done by adjusting an analog voltage which is placed on the capacitor. Hence, the previous-known solutions require a digital correction.

According to the preferred mode, the operation is corrected by changing the bias voltage that is applied to the capacitors. In the prior art, each of the capacitors C1, C2, . . . CN, receives the same voltage: typically the rail voltage VDD. According to this system, at least a number of the capacitors receive customized voltages which are different than the rail voltage. These voltages are customized to correct for the differential non-linearity error caused by errors in scaling of the values of the capacitors.

In a first preferred mode, the corrected voltages are produced by digital-to-analog converters which are driven by a memory storing correction values.

Another alternative which is completely analog uses a variable resistor or resistor ladder to do this.

DESCRIPTION OF THE DRAWINGS

These and other aspects will now be described in detail with reference to the accompanying drawings, wherein.

DESCRIPTION OF THE EMBODIMENTS

Figure 2:
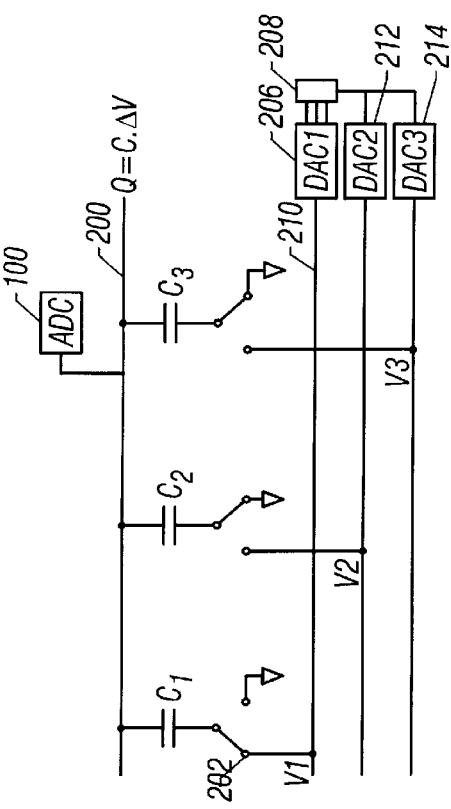
FIG. 2 shows a first embodiment using a biased capacitor bank to operate an A/D converter.

FIG. 2 shows a preferred embodiment of the compensation system. The output charge on the line 200, which is connected to the A/D converter 100, is proportional to the voltage on the capacitors and the values of the capacitors. The capacitors in FIG. 2 are scaled similarly to those in FIG. 1: where a value of each capacitor $C_n = C_x \cdot 2^n + \text{offset}_n$, where n ranges from 0 to the number of total bits-1. The offset$_n$ represents the differential non-linearity for the specific bit, which represents the undesired effect.

The output charge on the line 200 drives the A/D converter and provides a reference for determining whether the current estimate of the A/D converter is correct. According to this embodiment, an active node 202 of the capacitor is connected to a voltage which differs from VDD by an amount which compensates for the error in capacitance value. All or just some of the capacitors can be compensated in this way. If only some of the capacitors are corrected, it is preferably the ones corresponding to the most significant bits.

Assuming FIG. 2 is to represent a three-bit A/D converter, the charge on the line 200 can be expressed as follows.

$$Q = (C_x + DNL_1) \cdot \Delta V_1 + (2C_x + DNL_2) \cdot \Delta V_2 + (4C_x + DNL_3) \cdot \Delta V_3 \quad \text{(Equation 1)}$$

Differential non-linearities in the A to D converter are measured using a standard technique. The differential non-linearities associated with each of the bits is then taken as known, hence, $DNL_1$, $DNL_2$, and $DNL_3$ are all known in equation (1). Then, since $Q = C\Delta V$, $V_1$, $V_2$, and $V_3$ can be calculated and stored as compensation values.

The compensation values are stored in programmable element 208 which can be, for example, fusible links or a memory. These values are used to drive the respective D/A converters which are preferably located on the same semiconductor substrate along with the A/D converter 100, and the capacitors C1 through C3. Each of the D/A converters 206, 212, and 214 produces a respective output. The DAC1 produces output 210 which represents the voltage value $V_1$. Similarly, DAC2 produces an output $V_2$ and DAC3 produces an output $V_3$. Effectively this changes the $\Delta V$ associated with the capacitor in a way which compensates for the respective non-linearity.

As described above, this solution, unlike other solutions, corrects the analog part of the analog to digital converter circuit.

Figure 3:
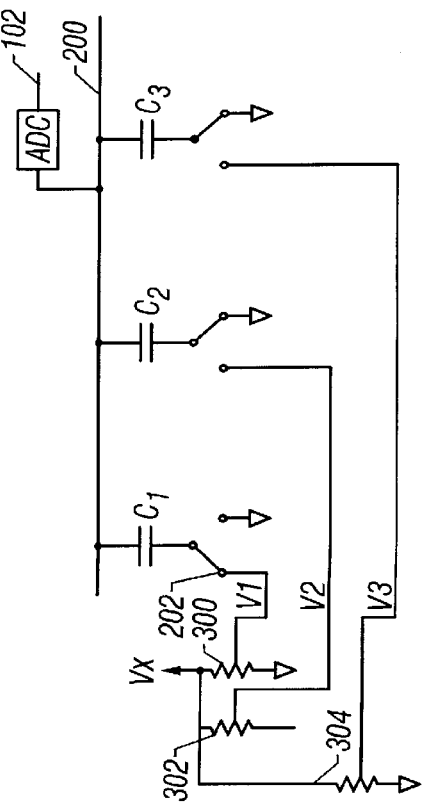
FIG. 3 shows a third embodiment using an all analog system with a potentiometer to operate the A/D converter bank.

A solution which is even more analog is shown in FIG. 3. FIG. 3 shows the same basic capacitor and A/D converter setup. However, in FIG. 3, a voltage $V_x$ is provided biasing three potentiometers 300, 302, 304. These potentiometers are set to a position where they will produce the desired output. For example, the potentiometer 300 is set to produce the voltage $V_1$, the potentiometer 302 is set to produce the voltage $V_2$, and the potentiometer 304 is set to produce the voltage $V_3$. This effectively carries out a totally analog solution to the problem, without requiring any on-chip digital circuitry.

Figure 4:
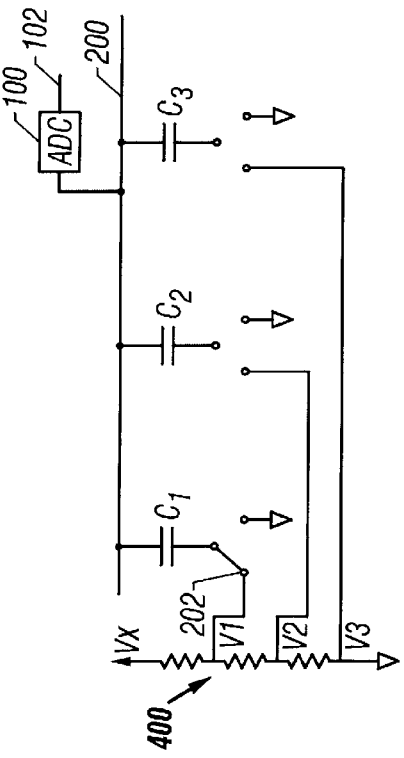
FIG. 4 shows a fourth embodiment using a resistor ladder.

Yet another totally analog solution is shown in FIG. 4. In this solution, the bias voltage $V_x$ biases a resistive ladder 400. Taps between the various resistances are attached to the respective active terminals, e.g., terminal 200. The voltage divider and taps are set such that the appropriate bias voltages $V_1$, $V_2$, $V_3$ are supplied to the appropriate pins.

Although only a few embodiments have been disclosed in detail above, those of skill in the art will certainly understand that modifications are possible in these embodiments while still maintaining within the teaching of the present invention and specifically within the claims.

For example, the preferred mode teaches the differential non-linearity-corrected total charge which is a reference for an A/D converter. However, the charge on line 200 could be used to drive any similar device which requires scaled charge. Other analog digital systems could be used to produce the DNL-corrective voltages $V_1$, $V_2$, $V_3$. In addition, while an example of 3-bits is given, it should be understood that this same system could be used to correct 1 bit, 2 bits, or any number of bits. This system could be used to correct all bits of A/D converter, or only some bits of the A/D converter. This same concept could also be used to correct a D/A converter.

While the preferred mode describes changing one of the switched values on the capacitor, either one or both could be changed.

All of these modifications are intended to be encompassed within the claims, in which:

What is claimed is:

1. A compensated analog-to-digital converter system, comprising:
    an analog-to-digital converter module, of a type which relies on scaled capacitors to determine an output value;
    an array of scaled capacitors said array comprising a plurality of capacitors, a common line connected commonly to one end of each of the capacitors, a plurality of switched connections, each connected to a second end of each of the capacitors, and switching the second end of said each capacitors between a first potential and a second potential which is different than the first potential;
    at least one of said first and second potentials being different on a first of said capacitors than it is on a second of said capacitors;
    wherein said first potential is a voltage, said second potential is ground, and a first voltage of the first potential that is connected to the first capacitor is different than a second voltage of a first potential which is connected to the second capacitor; and
    a value memory, storing first and second correction values for said first and second capacitors, a first programmable voltage-producing element, receiving said first correction value and responsively producing said first potential based on said first correction value, and a second programmable voltage-producing element, receiving said second correction value and responsively producing said first potential to the second capacitor based on said second correction value.

2. A system as in claim 1 wherein said programmable voltage-producing elements are D/A converters.

3. A system as in claim 1 wherein said voltages are produced by resistors.

4. A corrected analog-to-digital convert system, comprising:
    a semiconductor substrate;
    an analog-to-digital convert module formed on said semiconductor substrate, said analog-to-digital converter module being of a type which requires scaled capacitors for its operation;
    a bank of scaled capacitors, also formed on said semiconductor substrate, and coupled to said analog to digital converter, said bank of scaled capacitors including at least two corrected capacitors, which have different values from one another, a first corrected capacitor having a first end connected to a common charge line which is connected to said A/D converter, and a second end which is selectively changed between first potential and a second potential, and also having a second capacitor, also having its first end connected to said common charge line to said A/D converter, and also having a second end which is selectively changed between a third potential and a fourth potential;
    a variable voltage output circuit, producing a first potential which is connected to said first potential of said first capacitor, and producing a third potential which is coupled to said third potential of said second capacitor, said first and third potentials being different values; and
    a third capacitor, also having its first end connected to said common charge line and to said A/D converter, and having its second end also switched between a fourth potential and a fifth potential, and further comprising another output circuit producing another variable voltage connected to said fifth potential, each of said first, third, and fifth potentials being different from one another.

5. A system as in claim 4 further comprising a resistor which produces said first, third, and fifth potentials.

6. A corrected analog-to-digital converter system comprising:
    a semiconductor substrate;
    an analog-to-digital converter module formed on said semiconductor substrate, said analog-to-digital converter module being of a type which requires scaled capacitors for its operation;
    a bank of scaled capacitors, also form on said semiconductor substrate, and coupled to said analog to digital converter, said bank of scaled capacitors including at least two corrected capacitors, which have different values from one another, a first corrected capacitor having a first end connected to a common charge line which is connected to said A/D converter, and a second end which is selectively changed between a first potential and a second potential, and also having a second capacitor, also having its first end connected to said common charge line to said A/D converter, and also having a second end which is selectively changed between a third potential and a fourth potential;

a variable voltage output circuit, producing a first potential which is connected to said first potential of said first capacitor, producing a third potential which is coupled to said third potential of said second capacitor, said first and third potentials being different values;

a third capacitor, also having its first end connected to said common charge line and to said A/D converter, and having its second end also switched between a fourth potential and a fifth potential, and further comprising another output circuit producing another variable voltage connected to said fifth potential, each of said first, third, and fifth potentials being different from one another; and a memory, storing values indicative of capacitance errors between said first, second, and third capacitors, and a variable voltage-producing devices, producing said first, third, and fifth potentials, based on values in said memory.

7. A system as in claim 6 wherein said second, fourth, and sixth potentials are ground.

8. A method of corrected a total charge output from a device, comprising:

providing a plurality of scaled capacitors which are scaled relative to one another, but which include an error in the scaling relative to one another; and producing an analog correction factor which compensates for said error;

using said scaled capacitors with an A/D converter and wherein the charge output is an output to said A/D converter, and wherein said analog correction factor corrects a voltage that is applied to one side of said scaled capacitor so that at least one of said scaled capacitors receives a voltage on said one side which is different than another of said scaled capacitors;

wherein said producing an analog correction factor comprises programming a programmable D/A converter to produce a variable analog output voltage.

9. A corrected analog-to-digital converter circuit, comprising:

an analog-to-digital converter circuit, of a type which relies on scaled capacitors for its operation;

a bank of scaled capacitors, connected to said A/D converter circuit; and a programmable differential non-linearity converter circuit, producing an analog value that at least partly corrects for differential non-linearity errors in said bank of scaled capacitors, said circuit being programmed with values to correct for said differential non-linearity errors.

* * * * *

UNITED STATES PATENT AND TRADEMARK OFFICE
CERTIFICATE OF CORRECTION

PATENT NO.   : 6,215,428 B1
DATED        : April 10, 2001
INVENTOR(S)  : Eric R. Fossum It is certified that error appears in the above-identified patent and that said Letters Patent is hereby corrected as shown below:

<u>Title page,</u>
Item [57], ABSTRACT, in the last sentence, please change "CAV" to -- C$\Delta$V --.

Illustrative Figure, please change "Q=C.$\Delta$V" to -- Q=C$\Delta$V --.

Figure 1:
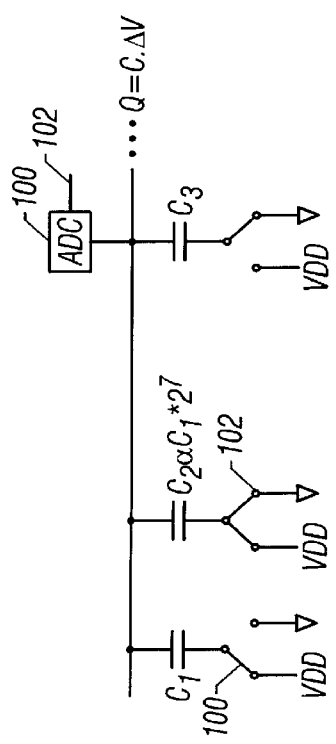
FIG. 1 shows a prior art system of operating A/D converter using a capacitor bank.

FIG. 1, please change "Q=C.$\Delta$V" to -- Q=C$\Delta$V --.

FIG. 2, please change "Q=C.$\Delta$V" to -- Q=C$\Delta$V --.

Signed and Sealed this

Twenty-second Day of October, 2002

Attest:

Attesting Officer

JAMES E. ROGAN
*Director of the United States Patent and Trademark Office*